United States Patent
Farooq et al.

(10) Patent No.: US 6,574,859 B2
(45) Date of Patent: Jun. 10, 2003

(54) INTERCONNECTION PROCESS FOR MODULE ASSEMBLY AND REWORK

(75) Inventors: Shaji Farooq, Hopewell Junction, NY (US); Mario J. Interrante, New Paltz, NY (US); Sudipta K. Ray, Wappingers Falls, NY (US); William E. Sablinski, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 09/785,787

(22) Filed: Feb. 16, 2001

(65) Prior Publication Data

US 2001/0005314 A1 Jun. 28, 2001

Related U.S. Application Data

(62) Division of application No. 09/014,804, filed on Jan. 28, 1998.

(51) Int. Cl.$^7$ ................................................ H05K 3/36
(52) U.S. Cl. ...................................................... 29/830
(58) Field of Search ............... 29/890, 830; 228/180.22

(56) References Cited

U.S. PATENT DOCUMENTS

| | | | |
|---|---|---|---|
| 5,075,965 A | * | 12/1991 | Carey et al. |
| 5,130,779 A | | 7/1992 | Agarwala et al. |
| 5,147,084 A | | 9/1992 | Behun et al. |
| 5,234,149 A | | 8/1993 | Katz et al. |
| 5,251,806 A | | 10/1993 | Agarwala et al. |
| 5,326,016 A | | 7/1994 | Cohen et al. |
| 5,458,281 A | | 10/1995 | Shibukawa |
| 5,535,526 A | | 7/1996 | White |
| 5,542,174 A | | 8/1996 | Chiu |
| 5,551,627 A | | 9/1996 | Leicht et al. |
| 5,591,941 A | | 1/1997 | Acocella et al. |
| 5,598,036 A | * | 1/1997 | Ho |
| 5,655,703 A | * | 8/1997 | Jimarez et al. |
| 5,729,440 A | * | 3/1998 | Jimarez et al. |
| 5,729,896 A | * | 3/1998 | Dalal et al. |
| 5,736,790 A | | 4/1998 | Iyogi et al. |
| 5,763,059 A | | 6/1998 | Yamaguchi et al. |
| 5,838,069 A | | 11/1998 | Itai et al. |
| 5,859,407 A | | 1/1999 | Saiki et al. |
| 5,889,322 A | | 3/1999 | Hamada et al. |
| 5,912,505 A | | 6/1999 | Itoh et al. |

FOREIGN PATENT DOCUMENTS

JP 9-270444 10/1997

* cited by examiner

*Primary Examiner*—Carl J. Arbes
(74) *Attorney, Agent, or Firm*—DeLio & Peterson LLC; Robert Curcio; Todd M. C. Li

(57) ABSTRACT

An interconnection structure and methods for making and detaching the same are presented for column and ball grid array (CGA and BGA) structures by using a transient solder paste on the electronic module side of the interconnection that includes fine metal powder additives to increase the melting point of the solder bond. The metal powder additives change the composition of the solder bond such that the transient melting solder composition does not completely melt at temperatures below +230° C. and detach from the electronic module during subsequent ref lows. A Pb—Sn eutectic with a lower melting point is used on the opposite end of the interconnection structure.

In the first method a transient melting solder paste is applied to the I/O pad of an electronic module by means of a screening mask. Interconnect structures are then bonded to the I/O pad.

In a second method, solder preforms in a composition of the transient melting solder paste are wetted onto electronic module I/O pads and interconnect columns or balls are then bonded.

Detachment of an electronic module from a circuit card can then be performed by heating the circuit card assembly to a temperature above the eutectic solder melting point, but below the transient solder joint melting point.

25 Claims, 6 Drawing Sheets

INTERCONNECTION PROCESS FOR MODULE ASSEMBLY AND REWORK

This is a divisional of copending application Ser. No. 09/014,804 filed on Jan. 28, 1998.

BACKGROUND OF THE INVENTION

1. Field of the Invention

The present invention relates generally to a new interconnection and a method for making and detaching the same, and more particularly, to a solder connection. This invention addresses the card assembly/rework issues associated with column and ball grid array (CGA and BGA) structures by introducing an interconnection structure with a transient liquid solder interface that includes fine metal powder additives.

2. Description of Related Art

Ceramic column grid array (CGA) packages are being used for many high performance ASIC chips and microprocessor chips for IBM and original engineering manufacturer (OEM) customers. The preferred processes for lowest cost manufacturing and minimum handling damage during bond, assembly, and test are the wire CGA process and the ball grid array (BGA) process. However, inherent to the joining process of the wire CGA and BGA structure is an eutectic interface used in the column or ball attachment to the substrate pads. As a result, during circuit card joining and reworking of these packages, two problems are typically experienced. First, during joining, the solder composition attaching the columns to the substrate can melt causing the columns to tilt, thus, putting the interconnect structure out of alignment. Second, during rework to remove the CGA or BGA, columns or balls may be left on the circuit card. Currently, since the columns and balls are made of 90/10 Pb/Sn solder, this eutectic material residue remaining on the chip terminals and/or testing substrate pads must be individually removed. This is a labor intensive process that also critically increases the length of time that the card site must be kept within the temperature range necessary to facilitate removal of all the columns or balls (200–220° C.). Typically, a hand held hot gas tool with an integral vacuum nozzle is moved back and forth over the card site. The hot gas melts the eutectic solder on the circuit card lands, and the vacuum picks up the balls or columns from the lands. This process may be repeated, especially with columns which tilt or detach from the substrate during the vacuum "sweep" operation. Repeated localized heating to pick up columns has led to circuit card land delaminations causing the entire card to be unusable. Additionally, this problem will further develop as package sizes increase, and more columns or balls are added to the structure.

The prior art has dealt with these deficiencies in a number of diverse ways. In U.S. Pat. No. 5,130,779, issued to Agarwala et al., on Jul. 14, 1992, entitled, "SOLDER MASS HAVING CONDUCTIVE ENCAPSULATING ARRANGEMENT", an elongated solder interconnection is formed on an electronic carrier by capping a metal layer on a deposited solder mass. A further elongated solder interconnection is then formed by the addition of a second solder mass on the first solder mass capped with the metal layer. The melting point of the subsequent solder mass may be different than the first solder mass to facilitate component removal. The different melting points allow the low-melt solder to reflow to its mating substrate pad at a temperature lower than the high-melt solder's melting point. The primary purpose of the metal barrier layer is to prevent the migration of the intermediate melting point solder towards the low melt solder. Thus, while the low-melt solder flows, the high-melt solder remains in the solid state, as it does prior to the reflow cycle. Upon reflow, the encapsulated, high-melt solder on the electronic components and the low-melt solder deposited over this metal barrier layer forms a new solder mass having an intermediate melting point, which is higher than the melting point of the low-melt solder mass on the other side of the barrier layer. Thus, the electronic components can later be separated, as the low-melt solder mass would melt prior to the intermediate melting point solder mass. This prior art patent, however, does not address creating a transient liquid solder interface with fine metal powder additives, which after reflow and attachment to the substrate pads create a higher effective melting point interface.

In U.S. Pat. No. 5,326,016, issued to Cohen et al. on Jul. 5, 1994, entitled, "METHOD FOR REMOVING ELECTRICAL COMPONENTS FROM PRINTED CIRCUIT BOARDS", the leads of each component are connected to circuitry on the circuit board by a connection alloy comprised of two constituent metals and having a given melting point less than that of either of the constituent metals A removal alloy, having a particular melting point substantially below the given melting point of the connection alloy, and typically in the form of a wire, is heated to a temperature greater than its particular melting point but below the given melting point of the connection alloy. Next, the connection alloy on each of the leads of the integrated circuit are contacted by the molten removal alloy causing a reaction that also produces a molten state for the connection alloy. After the connection alloy has reached a molten state, the integrated circuit is safely separated from the circuit board. This process, however, does not utilize a metal powder mixed in the interface solder, balls and columns, being joined to the substrate prior to any card attachment or rework. Also, this process lowers the melting point of the interconnection joint to allow removal. In contrast, metal powder additions effectively increase the melting point of the interface, instead of lowering it. Metal powder additions do not melt during ball or column attachment to the substrate, or during card assembly or rework.

In U.S. Pat. No. 5,234,149, issued to Katz et al. on Aug. 10, 1993, entitled, "DEBONDABLE METALLIC BONDING METHOD", a method of joining a device or carrier to another substrate is taught, providing a bondable first metallurgy on the device side for the solder connections (ball) and providing a second metallurgy on the substrate side to which these solder balls can make electrical contact under pressure, but not wet, to create a permanent metallurgical bond. The solder ball is heated to a temperature that facilitates wetting the first but not the second metallization, whereby the device can be mechanically pulled away from the substrate while the melted solder balls are immersed in the liquid flux. However, there is no disclosure regarding changing the interface solder melting point by addition of high melting reacting powders.

Bearing in mind the problems and deficiencies of the prior art, it is therefore an object of the present invention to provide an interconnection structure between a device substrate or module assembly and a circuit card.

It is another object of the present invention to provide a low melting point solder layer that allows for an integrated circuit chip to be attached to the next level of packaging at substantially lower temperatures (approximately 100° C. less) than would the high melting point solder.

A further object of the present invention is to provide for a number of variations for a transient melting solder comprising a low melting alloy powder/powder mixture and a higher melting alloy additive in the form of a powder.

Another object of the present invention is to minimize the likelihood of handling damage occurring on the relatively fragile interconnect columns.

Still other objects of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an interconnect structure comprising: a first substrate; a second substrate; a connector for providing electrical and mechanical interconnection between the first and second substrates; a first solder bond at one end of the connector; and, a second solder bond at the opposite end of the connector, the second solder bond having a lower melting point than the first solder bond. The interconnect structure may be an elongated, conductive pin or column, or a conductive ball of substantially spherical shape.

The first solder bond of the interconnect structure comprises a combination of a Pb—Sn eutectic and a Pb—Sn alloy wherein the Pb in the alloy comprises from about 33–50% by weight of the alloy. The total of the Pb—Sn eutectic and the Pb—Sn alloy may be from about 80–98% by weight of the solder bond, or 90–98% by weight of the solder bond, depending upon the metal alloy used. For an 80–98% combination, a Pb—Sn alloy, Pt—Sn alloy, or Cu—Sn alloy would be used in the range of 2–20% by weight. Whereas, for a 90–98% combination, a Pd alloy, a Pt alloy, or a Cu alloy may be used in the range of 2–10% by weight. The second solder bond comprises a Pb—Sn eutectic.

In a second aspect, the invention is directed to a method for forming a connection between substrates comprising: bonding a connector to an electrical conductive portion of a first substrate, with a first solder composition having a first melting point by heating the first solder to a temperature higher than the first melting point; and, bonding an opposite end of the connector to an electrical conductive portion of a second substrate with a second solder composition having a second melting point, wherein the second melting point is lower than the first melting point. This method may be conducted in two ways. First, by applying the first solder composition to the electrical conductive portion of the first substrate by screening mask, such that the first substrate is reflowed, melting the first solder composition and wetting the electrical conductive portion of the first substrate. Or, second, by transferring solder preforms of the first solder composition to the electrical conductive portion of the first substrate by loading the solder preforms in a carrier such that the preforms align with the electrical conductive portion of the first substrate, and heating the preforms above the first melting point of the first solder composition.

In a third aspect, the invention comprises a method for forming an interconnect structure between a substrate with an I/O pad and a circuit card with a conductive land comprising: applying a solder composition of a first melting point to the substrate I/O pad; forming an intermediate assembly by loading the interconnect structure into a carrier wherein the interconnect structure is aligned with the substrate I/O pad and in position to form an array; heating the intermediate assembly to a temperature higher than the first melting point; extracting the substrate from the carrier such that the interconnect structure is bonded to the substrate; cleaning the substrate with the interconnect structures bonded thereto; inserting the substrate with the interconnect structures attached into the circuit card land; and, applying a solder composition of a second melting point to the circuit card land and the interconnect structure, wherein the second melting point is lower than the first melting point such that only the solder composition of the second melting point changes to a molten state.

In a fourth aspect, the present invention comprises a method for detaching two substrates joined by the interconnect structures described above, wherein the connector is bonded to a first substrate at one end with a solder composition of a first melting point, and to a second substrate at opposite end with a solder composition of a second melting point, the first melting point higher than the second melting point, the method comprising: heating the substrates with the connector attached to a temperature higher than the second melting point but lower than the first melting point such that the solder composition of the second melting point reaches a molten state; separating the substrates with the connector attached such that the connector remains attached to the substrate with the solder composition of the first melting point; and, cleaning the substrates of excess solder debris.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
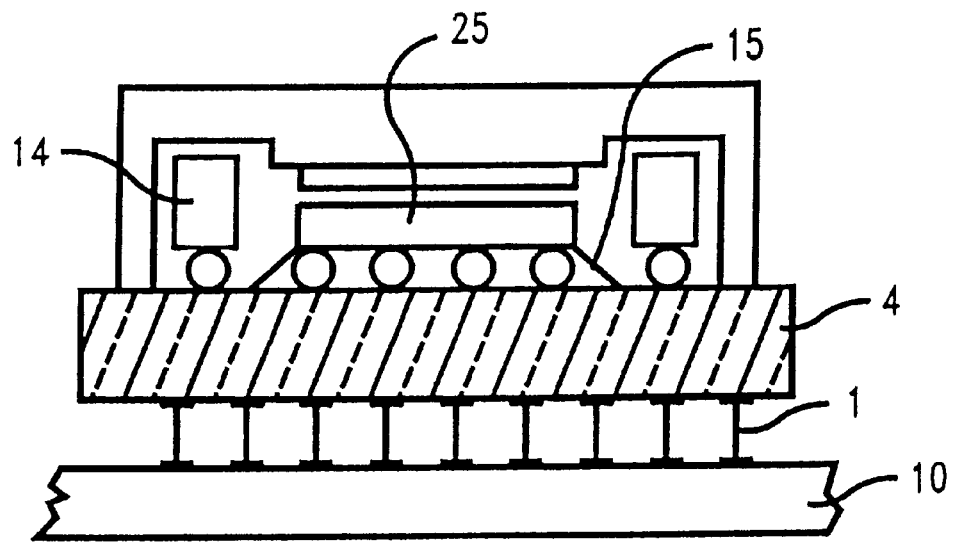
FIG. 1A is a schematic of a wire column grid array structure for an electronic module substrate after assembly to a circuit card.

In describing the preferred embodiment of the present invention, reference will be made herein to FIGS. 1–9 of the drawings in which like numerals refer to like features of the invention. Features of the invention are not necessarily shown to scale in the drawings.

This invention relates to an interconnection structure and a process for making and detaching the same. Chiefly, of a surface mount column or ball grid array for formation of an interconnection structure between an electronic module assembly and circuit board. Column Grid Arrays (CGAs) are conventionally created by joining a high melting solder column to a substrate by means of a low-melting solder. Alternatively, they are created by casting a high melting solder directly onto external pads on the ceramic substrate body. The latter process has some desirable characteristics, in that the joint to the substrate is high melting, and does not reflow during the attachment of the module assembly to the card. The former also has the advantage, in that the joint to the substrate is low-melting, and hence can be created late in the processing of the substrate without affecting the required temperature hierarchy of various processes. The advantage of joining the columns late is that there is minimum likelihood of handling damage occurring on the relatively fragile interconnect columns. Consequently, an interconnect structure and process that provides for a joint that allows attachment at relatively low temperatures, but which does not melt completely during card attach processing is desirable.

The present invention provides a composition of the solder bond at the interface of the interconnection structure and the electronic module such that the solder composition does not completely melt at temperatures below 220° C. and detach from the electronic module, thus, allowing the BGA/CGA structure to be joined to a circuit card below 220° C. The preferred composition of this solder bond is that of a transient melting solder paste comprising a combination of low melting alloy powder with a higher melting alloy additive. The opposite end of the BGA/CGA structure is bonded using a Pb/Sn eutectic. Due to the higher melting alloy additive in the transient melting solder paste, the Pb/Sn eutectic solder will have a lower melting point.

Figure 1B:
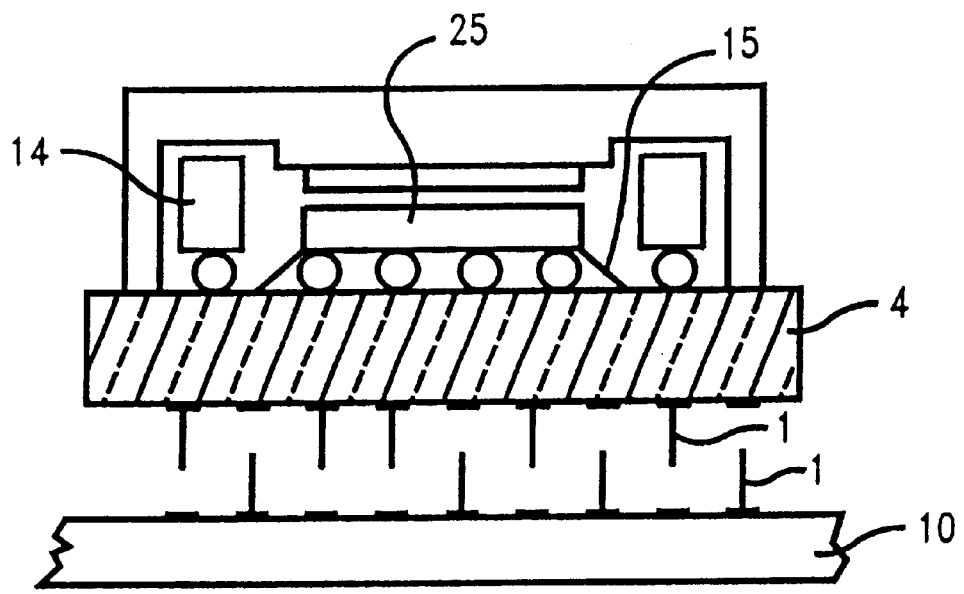
FIG. 1B is a schematic of a wire column grid array structure for an electronic module substrate after removal from a circuit card.
Figure 1C:
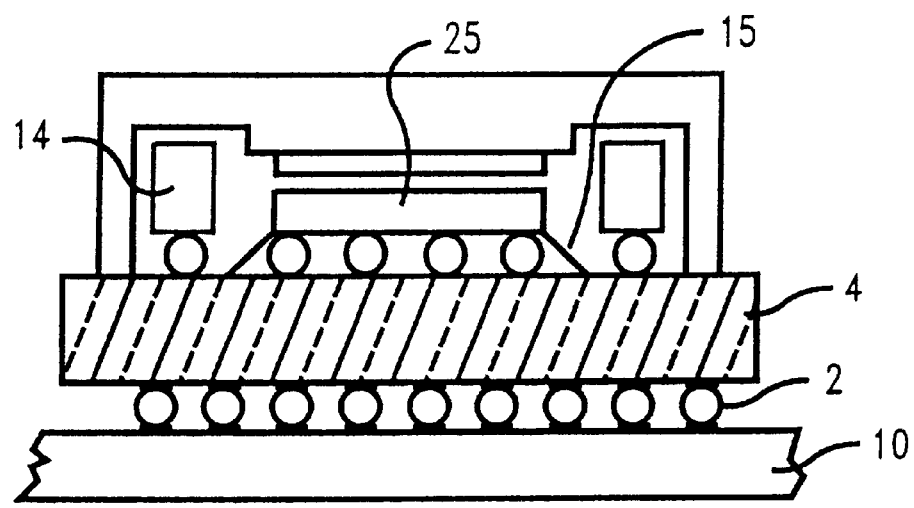
FIG. 1C is a schematic of a ball grid array structure for an electronic module substrate after assembly to a circuit card.

FIGS. 1A and 1B show schematically a wire column grid array structure 1 of an electronic module substrate 4 after assembly to a circuit card 10, and then after the module has been removed from the circuit card during a rework operation, respectively. The electronic module substrate also depicts a capacitor 14, encapsular 15, and flip chip 25 attached thereto. FIG. 1C depicts a ball grid array structure 2 after assembly to a circuit card 10. The need for rework is driven primarily by bad BGA/CGA joints to the card, and also to upgrade to a higher level chip or module. The balls or columns are typically 90/10 Pb/Sn with a melting point greater than 310° C. Both interfaces of the 90/10 Pb/Sn ball or column are a Pb/Sn eutectic. Thus, they will melt at a defined temperature during hot gas rework. When the module is picked up by a vacuum tip, a large number of balls or columns will remain on the card lands (20% to 60% is typically experienced in card manufacturing). This is schematically depicted in FIG. 1B for a CGA module. The card site must then be dressed, and the remaining balls or columns removed before a new module can be attached.

Figure 2A:
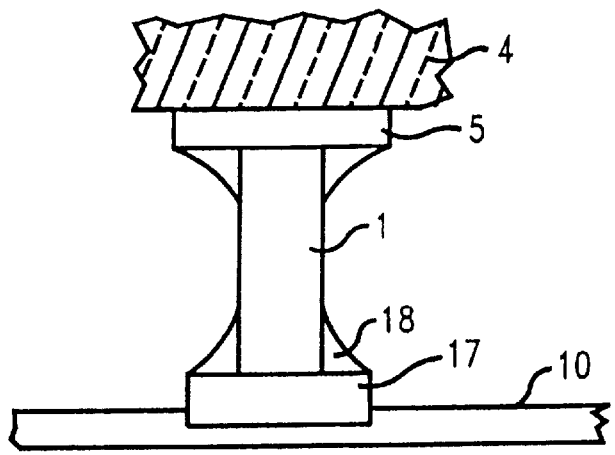
FIG. 2A is a cross-sectional view of a finished, assembled interconnection structure of a column grid array bonded to an electronic module substrate and a circuit card.
Figure 2B:
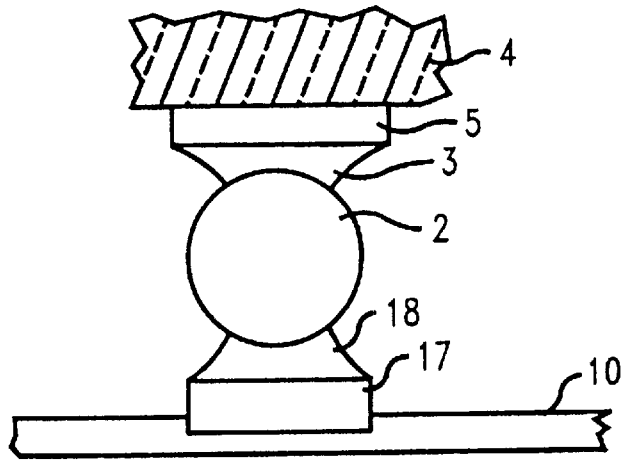
FIG. 2B is a cross-sectional view of a finished, assembled interconnection structure of a ball grid array bonded to an electronic module substrate and a circuit card.

FIG. 2A depicts the finished, assembled interconnection structure of a column grid array. The interconnect feature 1, which can be a cylindrical column, or an element of other geometries as well, like a sphere, etc., or any other combination thereof, is shown connected to electronic module substrate 4 and circuit card 10 through circuit card land 17. The opposite end of the column, as shown in FIG. 2A, is bonded to a circuit card land 17 using a Pb/Sn eutectic solder 18 of a melting point lower than that of the transient melting solder joint 3. The eutectic solder melting point is typically less than 200°C. For purpose of description, this invention will refer to interconnect feature 1 as a column, even though other geometries are allowed as well. FIG. 2B depicts a ball grid array 2 interconnection scheme. The circuit card 10 may be of an organic composition with a temperature tolerance level that is greater than the lower melting point.

Figure 1D:
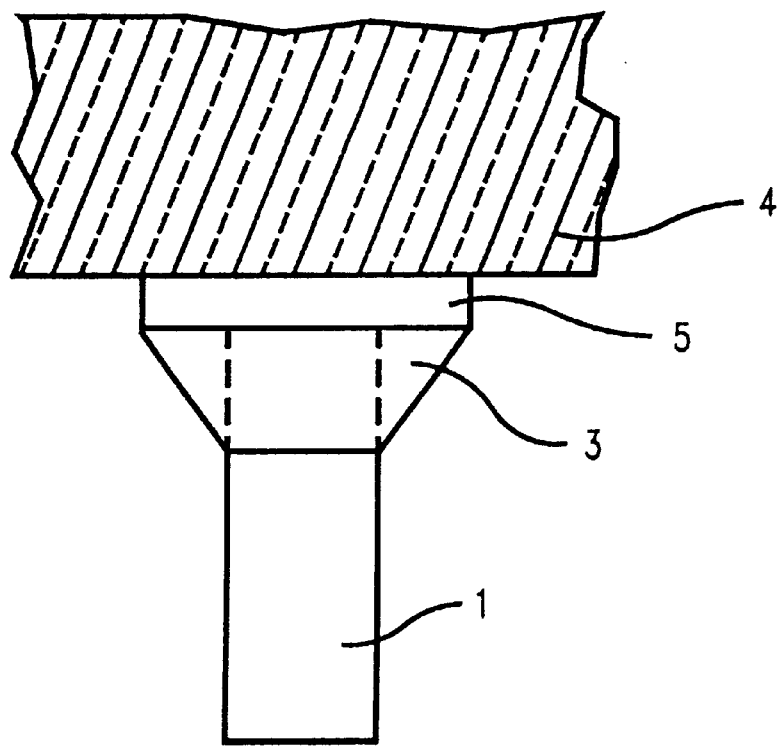
FIG. 1D a vertical cross-sectional view of a bonded column interconnect structure to an I/O pad of an electronic module substrate.

The connection is achieved by a transient melting solder joint 3 that includes fine metal power additives, which is used to attach column 1 to the input/output (I/O) pad 5 on substrate 4. The I/O pad 5 is usually plated with metallic layers to provide a wettable surface for solder attachment. FIG. 1D depicts a bonded column interconnect structure 1 to the I/O pad 5.

Two methods are proposed to fabricate this transient solder attachment scheme.

Figure 2C:
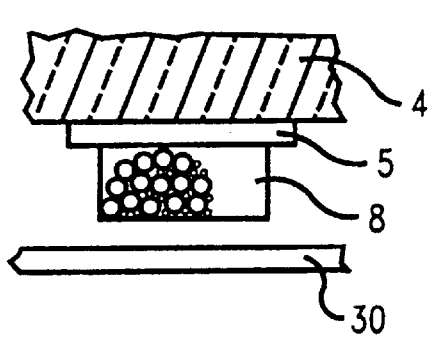
FIG. 2C is a cross-sectional view of an electronic module substrate I/O pad with transient melting solder paste applied.
Figure 2D:
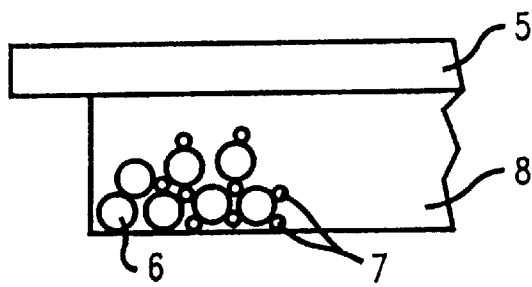
FIG. 2D is an expanded view of the electronic module substrate I/O pad of FIG. 2C.
Figure 3:
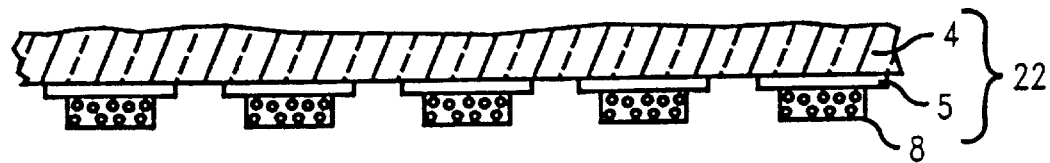
FIG. 3 is a cross-sectional view of a screened electronic module substrate with transient melting solder paste applied.

In the first method, referring to FIG. 2C, a transient melting solder paste 8, is applied to I/O pad 5 by means of a screening mask 30. Typically, the paste is screened on through a metal mask. The transient melting paste 8 comprises a low melting alloy powder/powder mixture 6, shown in FIG. 2D, consisting, for example, of an eutectic Pb/Sn alloy powder, or a Pb/Sn alloy powder in the range of 33–50% lead with remainder Sn by weight, or mixtures of powders in this composition range, and a higher melting alloying additive in the form of a powder 7. This additive has the property of reacting with the low melting solder during course of joining, to create a final joint composition with a liquidus (initial melting point) higher than that of the original mixture. The composition is chosen such that subsequent reflows (which take place during card joining) at temperatures greater than the eutectic temperature will only result in a partial liquidation of the lower melting solder composition. In addition, the formation of rigid contacts between individual solid phase particles by neck growth, grain growth, and coalescence during joining imparts sufficient strength to the joint to prevent loss of structural integrity during subsequent reflows. The screened electronic module substrate 22 is depicted in FIG. 3.

Figure 4:
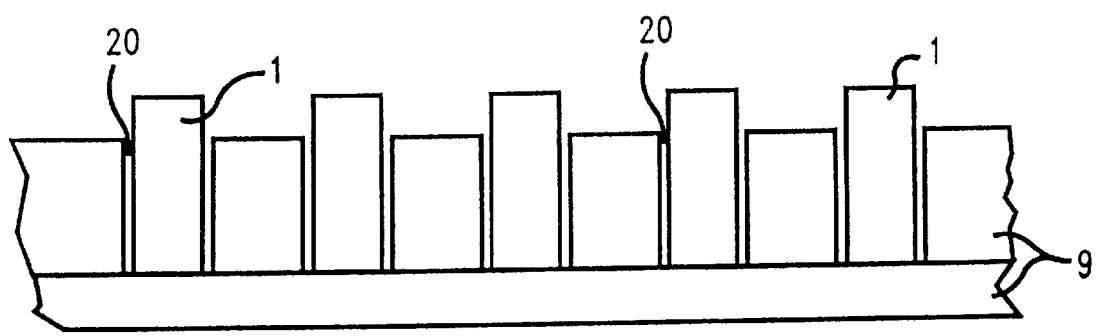
FIG. 4 is a cross-sectional view of interconnect column structures positioned by a carrier.

Referring to FIG. 4, columns 1 are then loaded into a carrier 9. The cavities 20 in the carrier are located in precise positions with respect to each other so as to form a desired array geometry.

Figure 5:
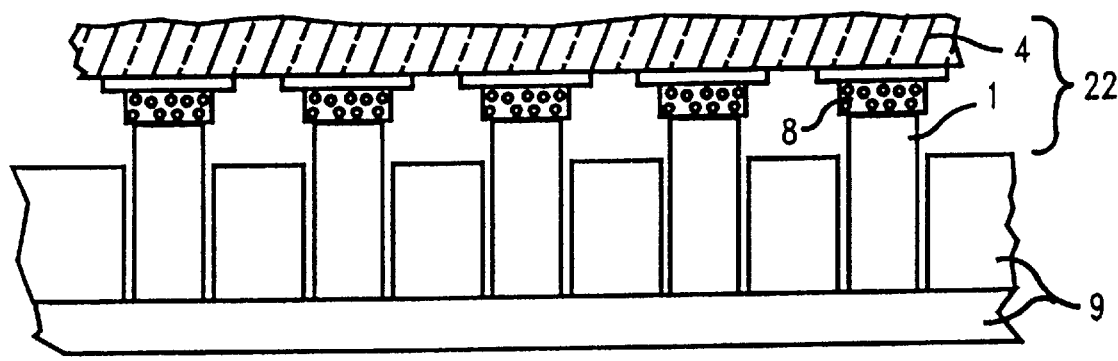
FIG. 5 is a cross-sectional view of a screened electronic module substrate aligned with a column grid array.

As shown in FIG. 5, the screened substrate 22, is positioned and held in place on top of the carrier 9 such that appropriate I/O pads 5 on screened substrate 22 match with columns 1 in carrier 9.

This intermediate assembly is then passed through a furnace such that all its elements experience a peak temperature in the range of 200–250° C., and remain at a dwell temperature above 183° C. for 1–10 minutes (these values are typical, even though higher or lower values may be used with similar results).

Figure 6:
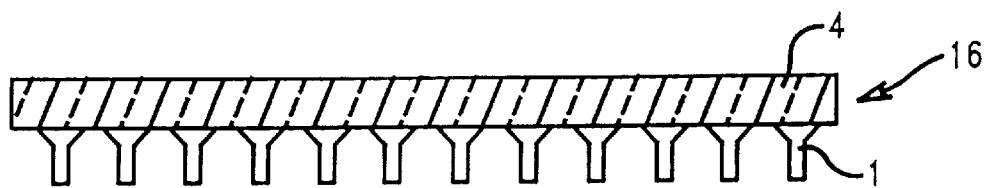
FIG. 6 is a cross-sectional view of an electronic module assembly with column interconnect structures attached.

Subsequent to this reflow, the substrate with columns 1 attached, is extracted from the carrier 9 and cleaned, resulting in a finished module assembly 16, shown in FIG. 6.

Suggested higher melting point alloying additive powders 7 are Pd, Pt, Cu, Pd—Sn intermetallics, Pt—Sn intermetallics, and Cu—Sn intermetallics, or any combination thereof. It is key that these powders have a high level of purity in order for them to be reactive. For example, the Pd powder may be annealed in pure hydrogen or forming gas between 400–900° C., and milled (if necessary to reduce agglomerates) to achieve the desired purity and particle size. Also, particle size control is important to control joint quality. For example, in the case of Pd, the desired particle size range is −400 mesh to +500 mesh. In general, particles in the size range 4–37 μm are acceptable, with a tighter control of the size range yielding better results.

In general, the solder paste composition is a combination of a Pb—Sn eutectic and a Pb—Sn alloy wherein the Pb in the alloy comprises from about 33–50% by weight of the alloy. The following solder paste compositions may be utilized based on the above (all percentages are on a metals basis; paste is made by adding flux to achieve the desired consistency for screening):

a) Pb—Sn eutectic with 37% Pb and 63% Sn by weight, +Pb(33%–50%)—Sn, together totaling 90–98% of the total weight, and Pd powder in the range 2–10% and particle size 4–37 μm;

b) Pb—Sn eutectic with 37% Pb and 63% Sn by weight, +Pb(33%–50%)—Sn, together totaling 80–98% of the total weight, and Pd—Sn powder in the range 2–20% and particle size 4–37 μm;

c) Pb—Sn eutectic with 37% Pb and 63% Sn by weight, +Pb(33%–50%)—Sn, together totaling 90–98% of the total weight, and Pt powder in the range 2–10% and particle size 4–37 μm;

d) Pb—Sn eutectic with 37% Pb and 63% Sn by weight, +Pb(33%–50%)—Sn, together totaling 80–98% of the total weight, and Pt—Sn powder in the range 2–20% and particle size 4–37 μm;

e) Pb—Sn eutectic with 37% Pb and 63% Sn by weight, +Pb(33%–50%)—Sn, together totaling 90–98% of the total weight, and Cu powder in the range 2–10% and particle size 4–37 μm; and, f) Pb—Sn eutectic with 37% Pb and 63% Sn by weight, +Pb(33%–50%)—Sn, together totaling 80–98% of the total weight, and Cu—Sn powder in the range 2–20% and particle size 4–37 μm.

Figure 7:
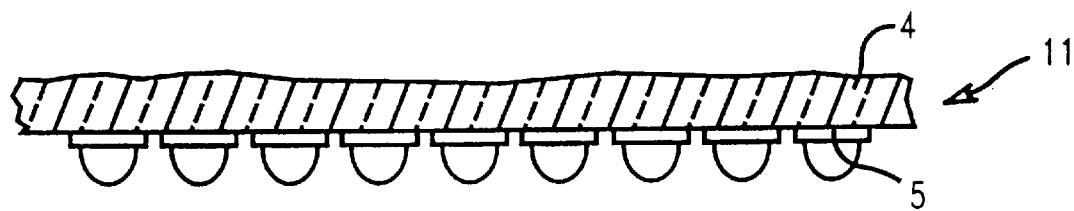
FIG. 7 is a cross-sectional view of an electronic module substrate with reflowed transient solder paste on the I/O pads.

In the second method, again referring to FIG. 2C, a transient melting paste 8, is applied to the I/O pads 5 by means of a screening mask. The screened substrate is reflowed such that the transient melting paste mixture melts and wets the I/O pad 5. The transient melting paste 8 comprises a low melting alloy powder/powder mixture 6, e.g., a eutectic Pb/Sn alloy powder, or a Pb/Sn alloy powder in the range of 33–50% lead with the remainder Sn, or mixtures of powders in this composition range, and a higher melting alloying additive in the form of a powder 7 shown in FIG. 2D. This additive has the property of combining with the low melting solder phase during course of joining, to create a final joint composition with a liquidus (initial melting point) higher than that of the original mixture. The composition is chosen such that subsequent reflows (which take place during joining to the card), at temperatures greater than the eutectic temperature, will only result in a partial liquidation of the lower melting solder composition. This screened substrate 22 is as depicted in FIG. 3. The screened substrate is reflowed such that the solder paste melts, and wets the I/O pads 5. This substrate with reflowed solder alloy 11 is shown in FIG. 7.

Figure 8:
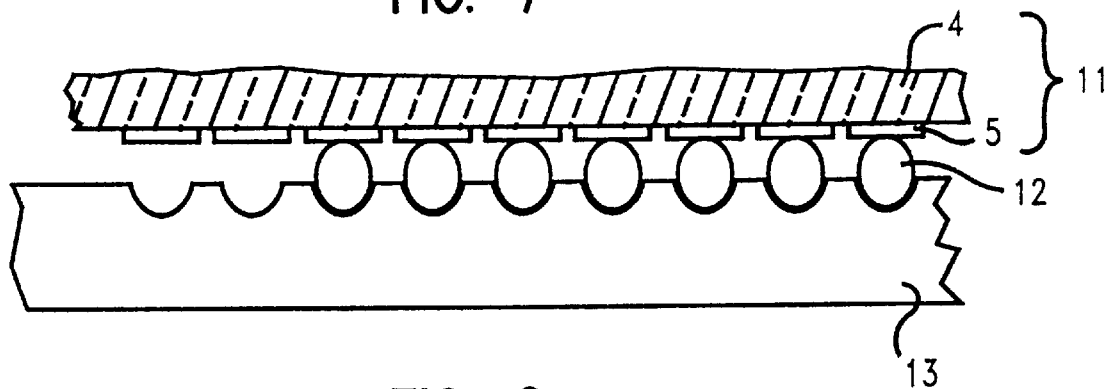
FIG. 8 is a cross-sectional view of solder preforms in a carrier aligned to the I/O pads of an electronic module substrate.

Alternatively, referring to FIG. 8, solder preforms 12 of the higher melting solder composition are loaded into a carrier 13, and transferred to the substrate 4 by placing the substrate in intimate contact with the solder preforms 12 (with a flux) during a temperature reflow which causes pre-form 12 to melt, and wet the I/O pads 5. This results in a substrate with reflowed solder alloy 11 as shown.

Columns 1 are then loaded into a carrier 9 as shown in FIG. 4. The cavities 20 in the carrier are located in precise positions with respect to each other so as to form the desired array.

Figure 9:
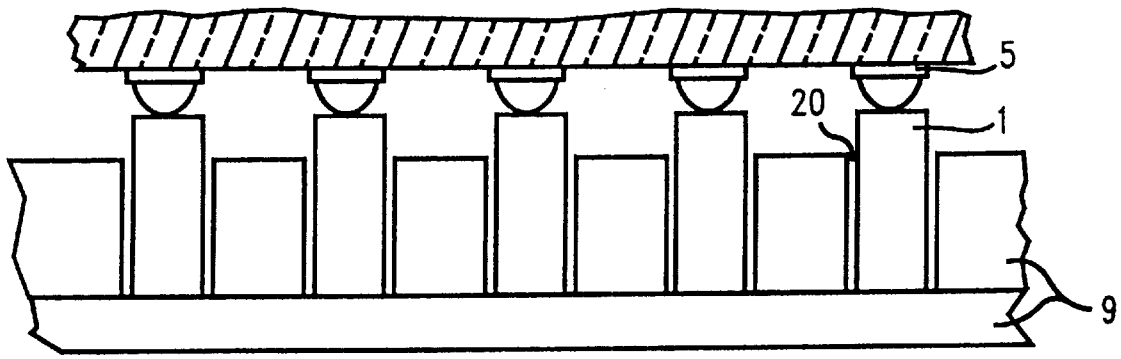
FIG. 9 is a cross-sectional view of transient solder paste reflowed on I/O pads of an electronic module substrate and aligned with column interconnect structures.

Referring to FIG. 9, the substrate with solder reflowed 11, is positioned and held in place on top of the carrier 9 such that appropriate I/O pads 5 on the substrate match with the columns 1 in 9.

This intermediate assembly is then passed through a furnace such that all its elements typically experience a peak temperature in the range of 200–250° C., and remain at a dwell temperature above 183° C. for 1–10 minutes.

Subsequent to this reflow, the substrate 11 with columns 1 attached, is extracted from the carrier 9 and cleaned, resulting in the module assembly structure 16 depicted in FIG. 6.

Suggested higher alloying additive powders 7 for this second method are Pd, Pt, Cu, Pd—Sn intermetallics, Pt—Sn intermetallics, and Cu—Sn intermetallics, or any combination thereof.

In general, the solder paste composition is a combination of a Pb—Sn eutectic and a Pb—Sn alloy wherein the Pb in the alloy comprises from about 33–50% by weight of the alloy. The following paste compositions may be utilized based on the above (all percentages are on a metals basis; paste is made by adding flux to achieve the desired consistency for screening):

a) Pb—Sn eutectic with 37% Pb and 63% Sn by weight, +Pb(33%–50%)—Sn, together totaling 90–98% of the total weight, and Pd powder in the range 2–10% and particle size 4–37 μm;

b) Pb—Sn eutectic with 37% Pb and 63% Sn by weight, +Pb(33%–50%)—Sn, together totaling 80–98% of the total weight, and Pd—Sn powder in the range 2–20% and particle size 4–37 μm;

c) Pb—Sn eutectic with 37% Pb and 63% Sn by weight, +Pb(33%–50%)—Sn, together totaling 90–98% of the total weight, and Pt powder in the range 2–10% and particle size 4–37 μm;

d) Pb—Sn eutectic with 37% Pb and 63% Sn by weight, +Pb(33%–50%)—Sn, together totaling 80–98% of the total weight, and Pt—Sn powder in the range 2–20% and particle size 4–37 μm;

e) Pb—Sn eutectic with 37% Pb and 63% Sn by weight, +Pb(33%–50%)—Sn, together totaling 90–98% of the total weight, and Cu powder in the range 2–10% and particle size 4–37 μm; and, f) Pb—Sn eutectic with 37% Pb and 63% Sn by weight, +Pb(33%–50%)—Sn, together totaling 80–98% of the total weight, and Cu—Sn powder in the range 2–20% and particle size 4–37 μm.

Using either of the methods described above, the resultant electronic module assembly 16, shown in FIG. 6, represents the interconnection structure 1 bonded to the electronic module substrate 4. The end of the interconnection structures opposite the electronic module substrate end are then bonded to the lands 17 of circuit card 10, as shown in FIG. 2A. The interconnection structure is bonded to circuit card land 17 using a Pb/Sn eutectic solder 18 of a melting point lower than that of the transient melting solder joint 3, and applying heat to the connected substrate assembly at a temperature higher than the lower melting point of the eutectic solder, but lower than the higher melting point of the transient solder paste. The eutectic solder melting point is typically less than 200° C., while the melting point of the transient solder paste is typically greater than 230° C. Once the connected substrates are bonded together, as shown in two representations, FIGS. 1A and 1C respectively, the assembly is cleaned of any extraneous solder debris.

Figure 10:
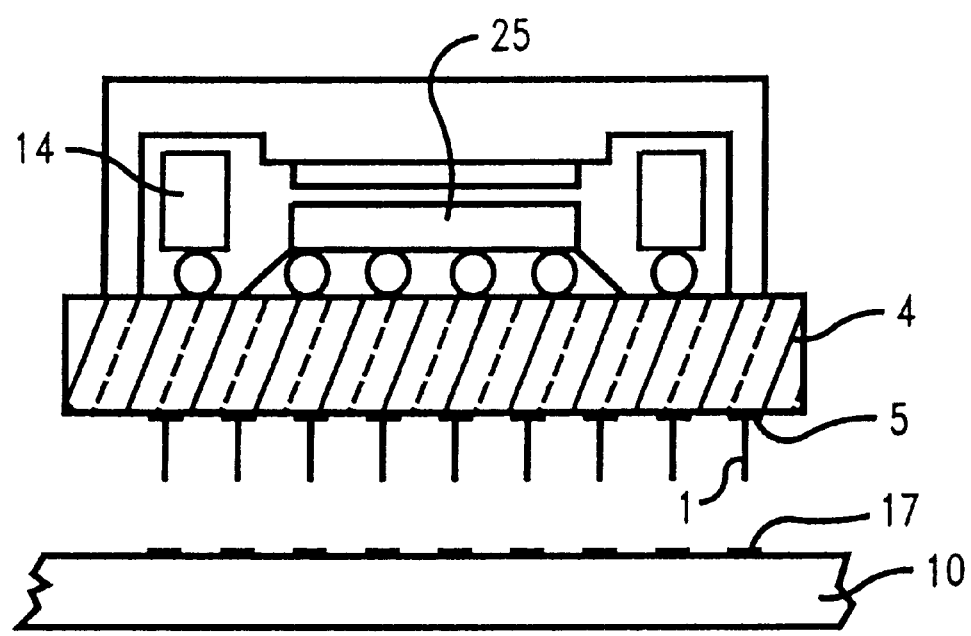
FIG. 10 is a cross-sectional view of an electronic module substrate with interconnection structures attached, detached from a circuit card.

Once the interconnection structure has been assembled using either of the methods described above, the advantage of having a connector with a higher melting solder bond on one end and a lower melting solder bond on the opposite end becomes apparent. Referring to FIG. 10, a clean detachment of the electronic module substrate 4 with all interconnection structures 1 attached is achievable by the following method: heating the substrates 4, 10, with the interconnection structure 1 attached, to a temperature higher than the melting point of the eutectic solder bonding the interconnect structure to the circuit card lands 17, but lower than the melting point of the transient solder paste bonding the opposite end of the interconnect structure to the electronic module substrate I/O pad 5, such that the eutectic solder composition of the lower melting point reaches a molten state; separating the substrates 4, 10 such that the connector 1 remains attached only to the electronic module substrate 4 bonded by the transient solder paste composition of the higher melting point; and cleaning the electronic module substrate 4 and the circuit card 10 of excess solder debris.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for forming a connection between substrates comprising:
   a) bonding a connector to an electrical conductive portion of a first substrate, with a first solder bond comprising a combination of a Pb—Sn eutectic and a Pb—Sn alloy having a combined first melting point, and an alloying additive powder having a melting point higher than said first melting point and making a joint composition paste with a liquidus higher than said first melting point, by heating said first solder to a temperature higher than said first melting point; and
   b) bonding an opposite end of said connector to an electrical conductive portion of a second substrate with a second solder bond comprising a eutectic having a second melting point, wherein said second melting point is lower than said first solder bond first melting point.

2. The method of claim 1 further comprising applying said first solder bond to said electrical conductive portion of said first substrate by screening mask, such that said first substrate is reflowed, melting said first solder bond and wetting said electrical conductive portion of said first substrate.

3. The method of claim 1 further comprising transferring solder preforms of said first solder bond to said electrical conductive portion of said first substrate by loading said solder preforms in a carrier such that said preforms align with said electrical conductive portion of said first substrate and heating said preforms above said first melting point of said first solder bond.

4. The method of claim 1 wherein said second solder bond comprises a Pb—Sn eutectic.

5. The method of claim 1 wherein said first solder bond comprises a combination of a Pb—Sn eutectic and a Pb—Sn alloy wherein said Pb in said alloy comprises from about 33–50% by weight of said alloy.

6. The method of claim 5 wherein the total of said Pb—Sn eutectic and said Pb—Sn alloy is from about 80–98% by weight of said solder bond.

7. The method of claim 5 wherein the total of said Pb—Sn eutectic and said Pb—Sn alloy is from about 90–98% by weight of said solder bond.

8. The method of claim 6 further including Pd—Sn alloy in the range of 2–20%.

9. The method of claim 6 further including Pt—Sn alloy in the range of 2–20%.

10. The method of claim 6 further including Cu—Sn alloy in the range of 2–20%.

11. The method of claim 7 further including Pd alloy in the range of 2–10%.

12. The method of claim 7 further including Pt alloy in the range of 2–10%.

13. The method of claim 7 further including Cu alloy in the range of 2–10%.

14. A method for forming an interconnect structure between a substrate with an I/O pad and a circuit card having a conductive land, said method comprising:
   a) applying a solder composition paste of a first melting point to said substrate I/O pad;
   b) forming an intermediate assembly by loading said interconnect structure into a carrier wherein said interconnect structure is aligned with said substrate I/O pad and in position to form an array;
   c) heating said intermediate assembly to a temperature higher than said first melting point;
   d) extracting said substrate from after said interconnect structure is bonded to said substrate;
   e) cleaning said substrate with said interconnect structures bonded thereto;
   f) inserting said substrate with said interconnect structures attached to said conductive land; and
   g) applying a eutectic solder composition of a second melting point to said conductive land and said interconnect structure, wherein said second melting point is lower than said first melting point such that only said solder composition of said second melting point changes to a molten state.

15. The method of claim 14 further comprising applying said solder composition of said first melting point to said I/O pad of said substrate by screening mask, such that said substrate is reflowed, melting said solder composition of said first melting point and wetting said I/O pad of said substrate.

16. The method of claim 14 further comprising transferring a solder pre-form of said solder composition of said first melting point to said I/O pad of said substrate by aligning said pre-form with said I/O pad of said substrate, and heating said pre-form above said first melting point of said solder composition of said first melting point.

17. The method of claim 14 wherein said solder composition of said first melting point comprises a Pb—Sn eutectic plus Pb(33%–50%)—Sn, together totaling 90–98%, and a Pd powder in the range 2–10% and particle sizes in the range of 4–37 μm.

18. The method of claim 14 wherein said solder composition of said first melting point comprises a Pb—Sn eutectic plus Pb(33%–50%)—Sn, together totaling 80–98%, and a Pd—Sn powder in the range 2–20% and particle sizes in the range of 4–37 μm.

19. The method of claim 14 wherein said solder composition of said first melting point comprises a Pb—Sn eutectic plus Pb(33%–50%)—Sn, together totaling 90–98%, and a Pt powder in the range 2–10% and particle sizes in the range of 4–37 μm.

20. The method of claim 14 wherein said solder composition of said first melting point comprises a Pb—Sn eutectic plus Pb(33–50%)—Sn, together totaling 80–98%, and a Pt—Sn powder in the range 2–20% and particle sizes in the range of 4–37 μm.

21. The method of claim 14 wherein said solder composition of said first melting point comprises a Pb—Sn eutectic plus Pb(33%–50%)—Sn, together totaling 90–98%, and a Cu powder in the range 2–10% and particle sizes in the range of 4–37 μm.

22. The method of claim 14 wherein said solder composition of said first melting point comprises a Pb—Sn eutectic plus Pb(33%–50%)—Sn, together totaling 80–98%, and a Cu—Sn powder in the range 2–20% and particle sizes in the range of 4–37 μm.

23. The method of claim 14 wherein said solder composition of said second melting point comprises a Pb—Sn eutectic.

24. The method of claim 14 wherein said heating of said intermediate assembly comprises applying heat at a peak temperature in the range of 200–250° C. and at a dwell temperature above 183° C. for 1–10 minutes.

25. A method for detaching two substrates joined by a connector wherein said connector is bonded to a first substrate at one end with a solder composition of a first melting point comprising a combination of a Pb—Sn eutectic and a Pb—Sn alloy having said first melting point, and an alloying additive powder having a melting point higher than said first melting point and making a joint composition paste with a liquidus higher than said first melting point, and to a second substrate at opposite end with a eutectic solder composition of a second melting point, said first melting point higher than said second melting point, said method comprising:

a) heating said substrates with said connector attached to a temperature higher than said second melting point but lower than said first melting point such that said solder composition of said second melting point reaches a molten state;

b) separating said substrates with said connector attached such that said connector remains attached to said substrate with said solder composition of said first melting point; and c) cleaning said substrates of excess solder debris.

* * * * *